(12) United States Patent
Wu et al.

(10) Patent No.: US 6,281,819 B1
(45) Date of Patent: Aug. 28, 2001

(54) DEVICE FOR ENOB ESTIMATION FOR ADC'S BASED ON DYNAMIC DEVIATION AND METHOD THEREFOR

(75) Inventors: Wen-Ching Wu, Hsinchu; Hui-Min Wang, TaiNan, both of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/541,859

(22) Filed: Apr. 3, 2000

(51) Int. Cl.$^7$ ............................................. H03M 1/10
(52) U.S. Cl. ................................. 341/120; 341/155
(58) Field of Search ................................. 341/120, 122, 341/131, 155

(56) References Cited

U.S. PATENT DOCUMENTS 5,525,984 * 6/1996 Bunker ................................. 341/131
6,177,894 * 1/2001 Yamaguchi ............................. 341/120

* cited by examiner

Primary Examiner—Trong Phan

(57) ABSTRACT

Disclosed are a device and method therefor for ENOB (effective number of bits) estimation for an ADC (analog-to-digital converter) based on dynamic deviation, wherein the correlation between dynamic deviation and ENOB is analyzed so as to provide a novel device and method therefor to estimate and calculate ENOB for an ADC. Dynamic deviation, provided in the present invention, can serve as a novel parameter for use in evaluation of the performance of an ADC. The present invention further provides a model related to the relation of distribution of dynamic deviation and input frequency, wherein ENOB can be therefore predicted for higher input frequency for an ADC without a high-quality signal generator by measuring dynamic deviation for lower input frequency.

8 Claims, 6 Drawing Sheets

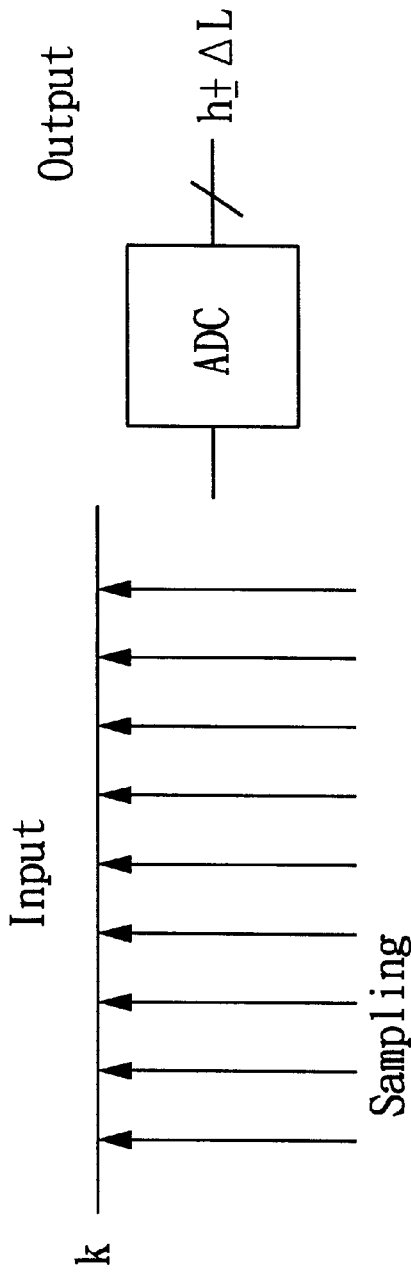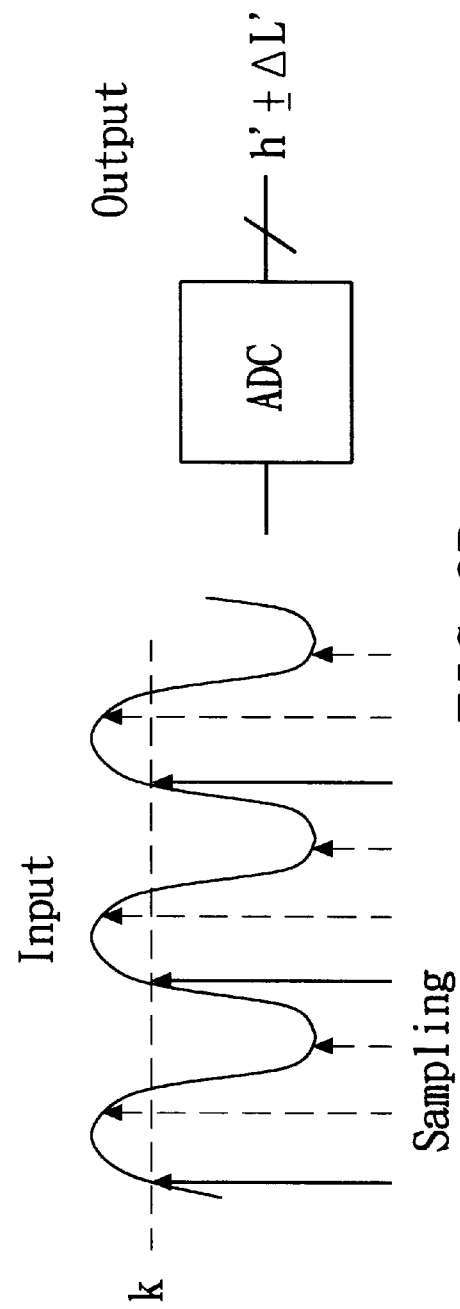

| Frequency(MHz) | 1.011 | | 4.438 | | 10.005 | |
|---|---|---|---|---|---|---|
| | Estimation | Experiment | Estimation | Experiment | Estimation | Experiment |
| ENOB(bit) | 8.782 | 8.763 | 8.717 | 8.695 | 8.569 | 8.602 |
| | 8.751 | 8.773 | 8.729 | 8.702 | 8.606 | 8.585 |
| | 8.777 | 8.736 | 8.666 | 8.652 | 8.601 | 8.544 |
| | 8.736 | 8.765 | 8.735 | 8.773 | 8.595 | 8.594 |
| | 8.778 | 8.782 | 8.694 | 8.648 | 8.601 | 8.545 |
| | 8.780 | 8.792 | 8.743 | 8.642 | 8.644 | 8.545 |
| | 8.789 | 8.822 | 8.714 | 8.693 | 8.583 | 8.548 |
| | 8.777 | 8.835 | 8.666 | 8.757 | 8.601 | 8.563 |
| | 8.749 | 8.776 | 8.747 | 8.689 | 8.556 | 8.531 |
| | 8.784 | 8.817 | 8.735 | 8.712 | 8.619 | 8.549 |
| | 8.789 | 8.857 | 8.714 | 8.673 | 8.583 | 8.570 |
| Average | 8.772 | 8.793 | 8.714 | 8.694 | 8.596 | 8.561 |
| Accuracy | 99.8% | | 99.8% | | 99.6% | |

TABLE. 1

DEVICE FOR ENOB ESTIMATION FOR ADC'S BASED ON DYNAMIC DEVIATION AND METHOD THEREFOR

1. FIELD OF THE INVENTION

The present invention generally relates to a device and method therefor for ENOB (effective number of bits) estimation for an ADC (analog-to-digital converter) based on dynamic deviation, wherein the correlation between dynamic deviation and ENOB is analyzed so as to provide a novel device and method therefor to estimate and calculate ENOB for an ADC. Such device and method can be used in fields of testing and measuring.

2. BACKGROUND OF THE INVENTION

Static noise is one of the related parameters generally used in ADCs (analog-to-digital converters). However, static noise is a static parameter and thus is not suitable for use in high speed ADCs. Moreover, ENOB (effective number of bits) is another key parameter for use in ADCs. The state-of-the-art measuring techniques utilize signal generators with high-speed and high-resolution to generate sinusoids that are pure enough. However, commonly used signal generators fail to meet the requirements for both high-speed and high-resolution. In lack of high quality signal generators, there is therefore a need for developing a method for ENOB estimation.

Several specifications must be examined when one desires to choose an ADC. Some of these parameters vary with different input frequencies, while others do not. The parameters that do not vary with different input frequencies are categorized as static parameters. The major static parameters for use in ADCs are differential non-linearity (DNL), integral non-linearity (INL), gain error, offset error, static noise, missing code and monotonic.

Since the parameters mentioned above can not vary with different input frequencies and thus fail to serve as parameters for evaluating the dynamic performance of a high-speed ADC. The major dynamic parameters for use in ADCs are signal-to-noise ratio (SNR), total harmonic distortion (THD), SNR and distortion (SINAD), Spurious-free dynamic range (SFDR), and effective number of bits (ENOB).

Another dynamic parameter for use in ADCs is dynamic deviation that is defined as the number of bits of instability in the output code under the condition that an ADC samples a constant level of a full-scale sinusoid.

Clock jitter is one of the factors that contribute to parameter degradation when an ADC is operated at high-speed and high-resolution. The jitter coming from the aperture uncertainty in the clock source produces enormous side lobes, degrading the dynamic performance. Fast-slewing square-wave clock source is recommended for testing high-speed and high-resolution ADCs. The clean, linear analog supply is used to avoid noises that could degrade ADC parameters.

The digital outputs of ADCs are collected in a high-speed data-capture memory. The collected data are then transferred to a computer for storage and analysis. There are two approaches to ENOB calculation from the collected data. One is derived from a formula by performing FFT (Fast Fourier Transform) operations. A windowing function is necessarily used to avoid errors resulting from spectral leakage due to non-coherence. The other way to calculate ENOB computes RMS error by using a least-mean-square curve fitting technique.

No matter which approach is chosen for ENOB calculation of a high performance ADC, signal generators with high-resolution and high-speed are required to provide sinusoids that are pure enough. If the provided sinusoids are not pure enough, the dynamic performance of an ADC is thus difficult to evaluate.

BRIEF DESCRIPTION OF THE INVENTION

In order to overcome the problems that have been previously discussed above, the present invention provides a novel parameter for use in ADCs, namely, dynamic deviation. Dynamic deviation can be used to replace static noise and also evaluate the dynamic performance of an ADC since the value of the former varies with different input frequencies of an ADC. Besides, dynamic deviation is extracted in a practical test setup, so that it also takes the effects of noises and clock jitter into account. The present invention is also suitable for use in signal systems with higher input frequencies.

On the other hand, by establishment of the model of the distribution of dynamic deviation versus input frequency, we are able to analyze the relation between the distribution of dynamic deviation and the input frequency, and further develop a method for ENOB estimation. Experimental results demonstrate that high accuracy of the proposed approach is achieved. Accordingly, the present invention provides researchers, circuit designers, and testing engineers who lack high-speed and high-resolution ADCs a method for ENOB estimation or test grading.

In order to accomplish the foregoing objects, the present invention provides a method for ENOB estimation for an ADC based on dynamic deviation, comprising steps of:

(1) building up the distributions of dynamic deviations for the interested input frequencies at which ENOBs will be estimated;

(2) calculating the ideal values that are sampled by an ADC in an ideal case according to the frequency and amplitude of the sinusoid and sampling rate of ADC;

(3) calculating the ideal codes with respect to the ideal values according to step (2);

(4) calculating the estimated codes by adding variations to the ideal codes according to step (3) with respect to the distributions of dynamic deviations according to step (1); and (5) estimating ENOB by performing FFT operations on these estimated codes according to step (4).

The distribution of dynamic deviation according to step (1) exhibits as a Gaussian distribution and varies its peak and expansion with different input frequencies. An ADC with better dynamic performance has higher peak and narrower expansion in the distribution of dynamic deviation. Therefore, dynamic deviation can serve as a novel parameter for use in evaluation of the performance of an ADC. Moreover, a more concentrated distribution of dynamic deviation is obtained for an ADC with a lower input frequency.

BRIEF DESCRIPTION OF THE DRAWINGS

The object, spirit and advantages of the preferred embodiment of the present invention will be readily understood by the accompanying drawings and detailed descriptions, wherein:

FIG. 2A is a schematic diagram for explanation of the static noise, wherein the signal driven to the input of an ADC keeps at a constant dc value;

FIG. 2B is a schematic diagram for explanation of the dynamic deviation, wherein the signal driven to the input of an ADC is a sinusoid;

FIG. 3A shows the relation between the input sinusoid signal of an ADC versus the sampling time.

FIG. 3B shows the ideal codes denoted as "×", the value of which are represented as the crossing points of the sinusoid and sampling time in accordance with FIG. 3A;

FIG. 3C shows the addition of variations to the ideal codes;

FIG. 3D shows the estimated codes by adding variations to the ideal codes;

DETAILED DESCRIPTION OF THE INVENTION

The present invention provides a device and method therefor for ENOB estimation for an ADC based on dynamic deviation, wherein the correlation between dynamic deviation and ENOB is analyzed so as to further provide a novel device and method therefor to estimate and calculate ENOB for an ADC.

Figure 1:
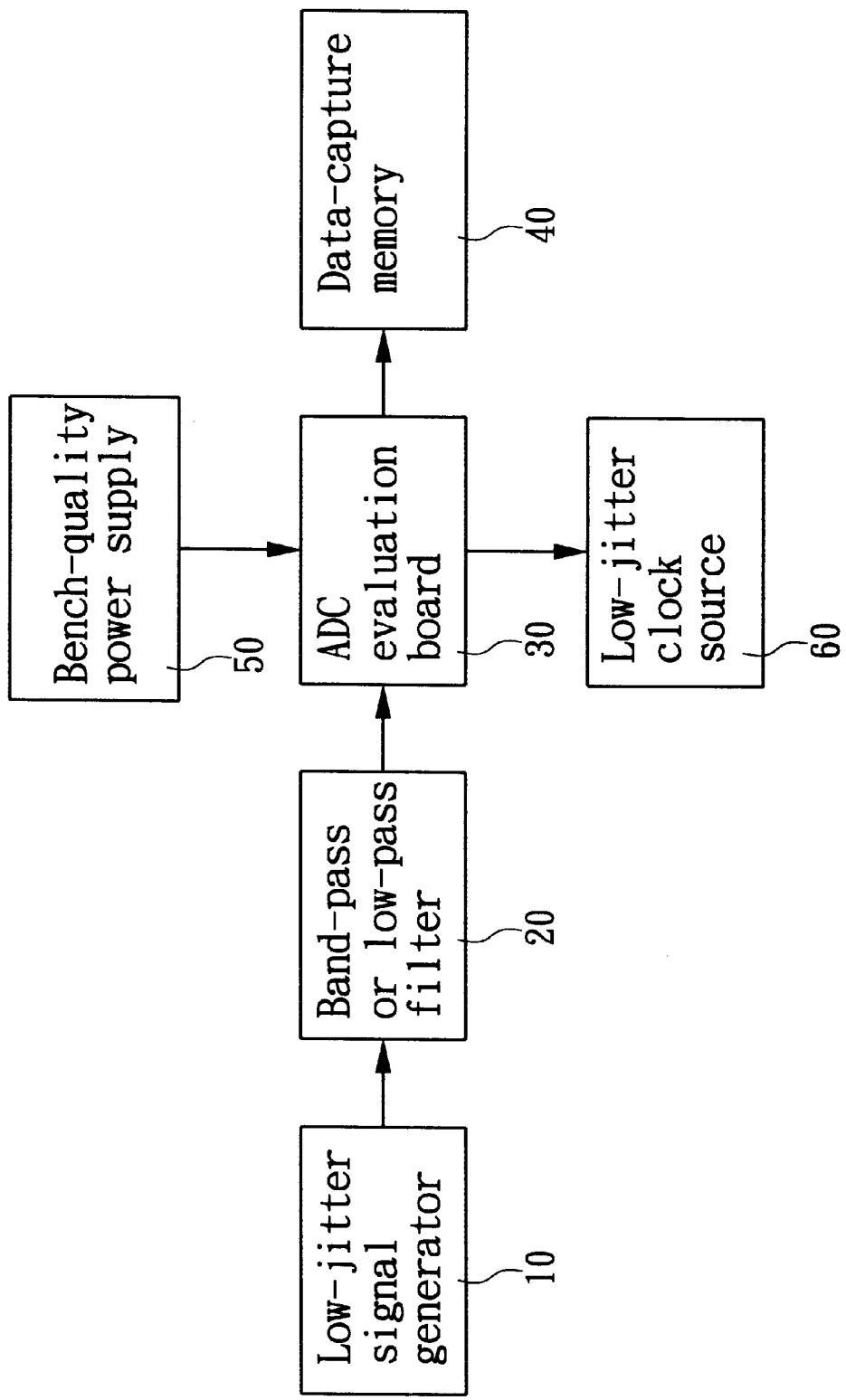
FIG. 1 is a block diagram illustrating a device for measuring ENOB of an ADC in accordance with the preferred embodiment of the present invention.

ENOB takes many ADC errors and thus provides an overall picture of said ADC. FIG. 1 is a block diagram illustrating a device for measuring ENOB of an ADC in accordance with the preferred embodiment of the present invention, wherein said device comprises: a low-jitter signal generator 10 for generating sinusoid signals; a low-pass filter 20 that is connected to the output of said low-jitter signal generator 10 to cooperate with said low-jitter signal generator 10 to generate pure sinusoid signals, wherein said low-pass filter can be replaced by a band-pass filter.

Moreover, as shown in FIG. 1, said device further comprises: an ADC evaluation board 30 for receiving the filtered sinusoid signal from the output of said low-pass filter 20 and then converting the received signals into digital ones; a data-capture memory 40 coupled to the output of said ADC evaluation board 30 for storing the digital sampled signals and providing them for further analysis; a bench-quality power supply 50 coupled to said ADC evaluation board 30 for providing the power source that the ADC needs; and a low-jitter clock source 60 coupled to said ADC evaluation board 30 for providing the timing signals that the ADC needs.

When ENOB of an ADC is measured, a low-pass or band-pass filter should be added to the signal generator so as to filter out extraneous harmonics and noises. However, input pure sinusoid signals are necessary to perform the ENOB calculation for a high-speed and high-resolution ADC. Since signal generators generally fail to meet the requirement for high-speed and high-resolution so as to generate pure sinusoid signals to test the high performance ADC accurately.

The present invention relates to a device and method therefor for ENOB estimation for an ADC based on dynamic deviation, wherein the correlation between dynamic deviation and ENOB is analyzed so as to provide a novel device and method therefor to estimate and calculate ENOB for an ADC. Dynamic deviation, provided in the present invention, can serve as a novel parameter for use in evaluation of the performance of an ADC. The present invention further provides a model related to the relation of distribution of dynamic deviation and input frequency. Said model can be used for ENOB calculation via the measuring of dynamic deviation. The preferred embodiment of the present invention has been demonstrated by experimental results that high accuracy is achieved. The provided model can be used to establish the distribution of dynamic deviation for higher input frequency. ENOB can be therefore predicted for higher input frequency for an ADC without a high-quality signal generator by measuring dynamic deviation for lower input frequency.

Accordingly, the detailed description hereinafter of the present invention will be divided into three major parts: 1. dynamic deviation analysis; 2. ENOB estimation for ADCs; 3. experimental results and analysis of the preferred embodiment.

1. Dynamic Deviation Analysis

Static noise is the number of bits of instability in the output code under the analog input held at a constant dc level. FIG. 2A is a schematic diagram for explanation of the static noise, wherein the signal driven to the input of an ADC keeps at a constant dc value, whose respective ideal code is k. The points at the arrowheads as shown in FIG. 2A are signals sampled by the ADC. The output of the ADC may be static at a constant code h instead of k. This may result from gain error, offset error, or other effects. Besides, the output code may not be static at a constant code h but deviating from h by several LSBs ($\Delta L$) due to noises or clock jitters.

If a dc voltage is applied to the input of an ADC, the output code is expected to vary no more than one LSB. But that is not so with these high-speed devices. This wavering is of little concern in high-speed applications because they do not usually deal with dc signals.

With respect to static noise, the provided dynamic deviation changes with different input frequencies and thus is a dynamic parameter. FIG. 2B is a schematic diagram for explanation of the dynamic deviation, wherein the signal driven to the input of an ADC is a sinusoid. The points at the arrowheads in FIG. 2B are also signals sampled by the ADC. Dynamic deviation records and analyzes the output codes only for the respective input code k (solid arrows in FIG. 2B). Similar to static noise, due to gain error, offset error or other effects, the output of the ADC may not be k and may vary around h' by several LSBs ($\Delta L'$) resulting from noises and clock jitter. However, dynamic deviation is a dynamic parameter and can take noises and clock jitter into consideration, therefore it can evaluate the dynamic performance of an ADC. The distributions of dynamic deviations in accordance with different input frequencies are obtained to build up a model of distribution of dynamic deviation and derive the relation between the distribution of dynamic deviation and input frequency of an ADC. This is very useful for ENOB estimation and calculation in accordance with the present invention.

2. ENOB Estimation for ADCs

As described above, with the establishment of a model of distribution of dynamic deviation, the relation between the distribution of dynamic deviation and the input frequency of an ADC is analyzed, and furthermore, a procedure for ENOB estimation for an ADC, based on the dynamic deviation, is proposed in the following steps:

(1) building up the distributions of dynamic deviations for the interested input frequencies at which ENOBs will be estimated;

(2) calculating the ideal values that are sampled by an ADC in an ideal case according to the frequency and amplitude of the sinusoid and sampling rate of ADC;

(3) calculating the ideal codes with respect to the ideal values according to step (2);

(4) calculating the estimated codes by adding variations to the ideal codes according to step (3) with respect to the distributions of dynamic deviations according to step (1); and (5) estimating ENOB by performing FFT operations on these estimated codes according to step (4).

Figure 3:
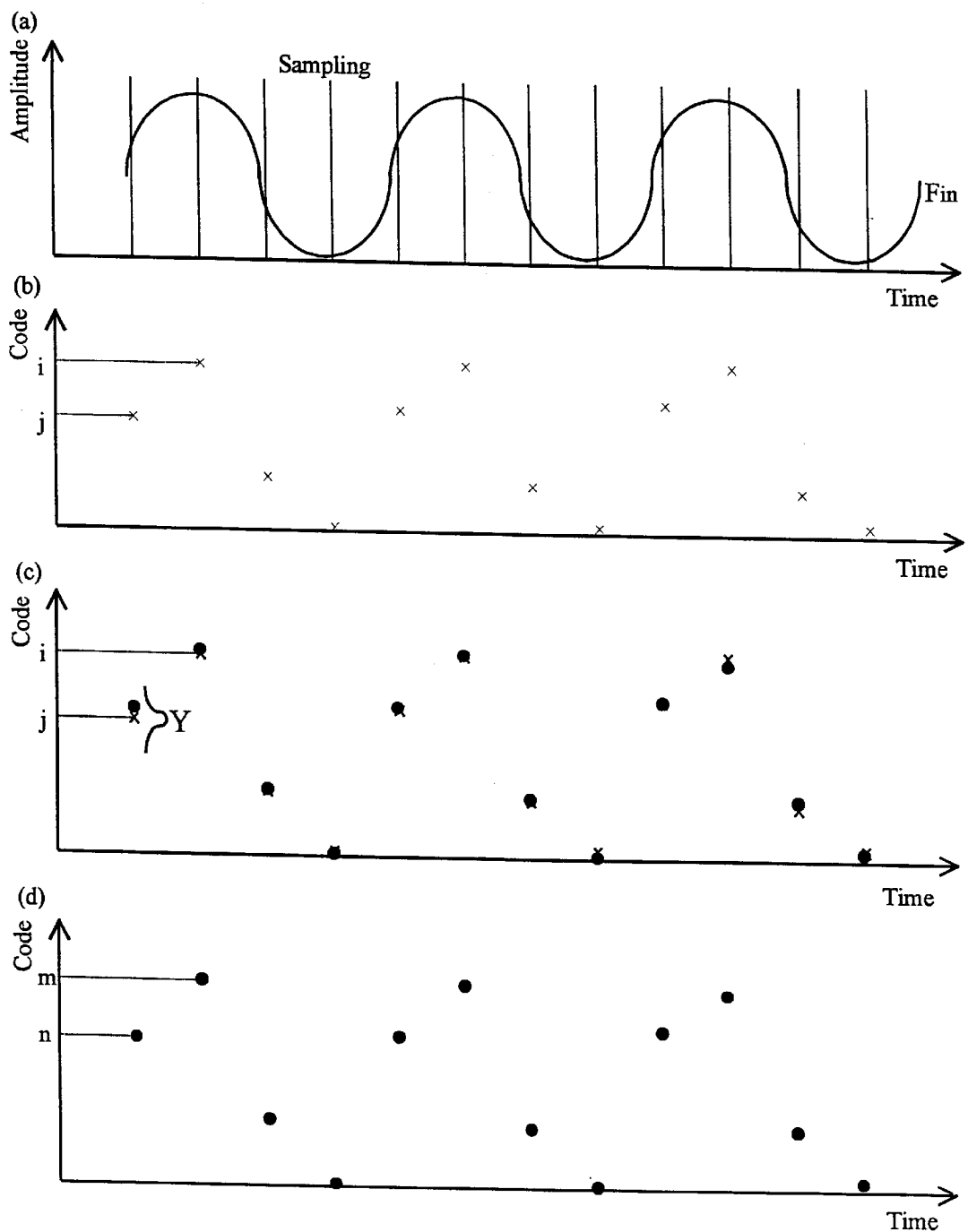
FIG. 3 demonstrates the procedure for ENOB estimation for an ADC in accordance with the preferred embodiment of the present invention.

For the method for ENOB estimation for ADCs in accordance with the present invention, please refer to FIG. 3, which demonstrates the procedure for ENOB estimation. To begin with, FIG. 3A shows the relation between the input sinusoid signal of an ADC versus the sampling time, wherein the sinusoid of frequency Fin is driven to the analog input of the ADC and the vertical lines represent the sampling times of the ADC. FIG. 3B shows the ideal codes denoted as "×", the value of which are represented as the crossing points of the sinusoid and sampling time in accordance with FIG. 3A. The amplitudes of the crossing points are the values that would be signals sampled by the ADC. The ideal codes of these crossing points can therefore be calculated. Quantization errors may be induced in this step. The ideal codes of the first two points in FIG. 3B are j and i, respectively. While, in real case, the output of an ADC would not be the ideal codes. Instead, it may vary by several LSBs, resulting from noises, clock jitter and other characteristics of the ADC.

Nevertheless, the relation between the ideal values of the input signals and the real values of the output signals of an ADC as well as the way to add variation to each point of the ideal code has never been investigated. Fortunately, dynamic deviation provided in the present invention considers this real test environment and makes the variations be estimable. According to the distribution of dynamic deviation for input frequency Fin, random numbers are generated to determine the values of the deviations. LSB is the unit of dynamic deviation. The reason that randomly generated numbers are used in the present invention is reasonable because the noises and clock jitter are also at haphazard.

We further define the estimated code as the code that mixes ideal code with dynamic deviation. FIG. 3C shows the addition of variations to the ideal codes and FIG. 3D shows the estimated codes by adding variations to the ideal codes, wherein the points denoted as "•" are estimated codes and Y in FIG. 3C is the distribution of dynamic deviation. ENOB can be estimated by performing FFT operations on these estimated codes as shown in FIG. 3D. The estimated codes of the first two points are n and m, respectively, and their added variations are (n-j) LSBs and (m-i) LSBs, respectively.

3. Experimental Results and Analysis of the Preferred Embodiment

In accordance with the preferred embodiment of the present invention, experiments were made by measuring a well-tested product, which was a 10-bit, 3.3 V, 30 MSPS A/D converter, designed in a pipelined sequential successive approximation register (SSAR) architecture.

3.1 Setup of our Test

Our test, briefly, was to apply a sine-wave analog input (through a built-in filter) to an ADC, capture its digital outputs in an array, and then analyze the captured, digitized waveform with time series analysis utility. We used a mixed signal LSI tester, HP9494, to build the test setup.

HP9494 provides a 12-bit, 128 MHz arbitrary waveform generator (AWG) and a 18-bit, 1 MHz AWG. For these AWGs, many optional built-in filters can be selected to produce an even cleaner sine wave. The digital sequence program in HP9494 system provides well overall synchronization among the clock generator, the signal generator, and the data capture memory.

Data acquisition system can record 256K words. The test system provides FFT operations and very useful time series analysis in computing spectrum, signal-to-noise ratio and distortion, and total harmonic distortion (FFT_I2, SPECT_I2, SNR_I2, THD_I2, respectively). For the analysis, we chose a 1024-point FFT (for 10-bit ADC). Because HP9494 well synchronizes the analog input, clock, and capture system, we can get coherent data from the digital outputs to perform FFT operation without windowing function. ENOB is then calculated from the formula (SINAD-1.76)/6.02.

3.2 Modeling of Distribution of Dynamic Deviation

Figure 4:
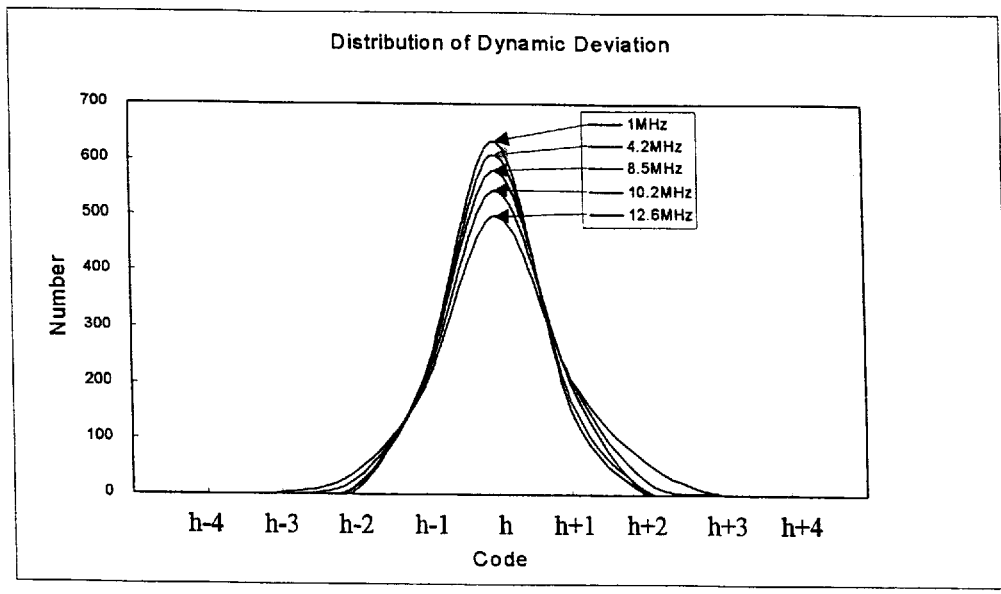
FIG. 4 shows the distributions of the dynamic deviations with respect to different input frequencies in accordance with the preferred embodiment of the present invention.

Taking a further step into the investigation of dynamic deviation, we found that 1000 output codes with respect to the same input code were captured and recorded for further studying dynamic deviation. Counting the numbers of output codes, we found that the numbers exhibited distributions as shown in FIG. 4, which showed the distributions of the dynamic deviations with respect to different input frequencies in accordance with the preferred embodiment of the present invention. The trace with the highest peak was the distribution of dynamic deviation for applying 1.0 MHz sinusoid to the input of the ADC. And then came the traces representing 4.2 MHz, 8.5 MHz, 10.2 MHz, and 12.6 MHz in order. These curves demonstrated that the higher the input frequency was, the lower the peak and the wider the expansion were.

The curves of the distributions of dynamic deviations in FIG. 4 can be curve fitted by Gaussian equation:

$$Y = Y_0 + \frac{A}{\omega\sqrt{\pi/2}} e^{\frac{-2(X-X_0)^2}{\omega^2}} \quad (1)$$

Figure 5:
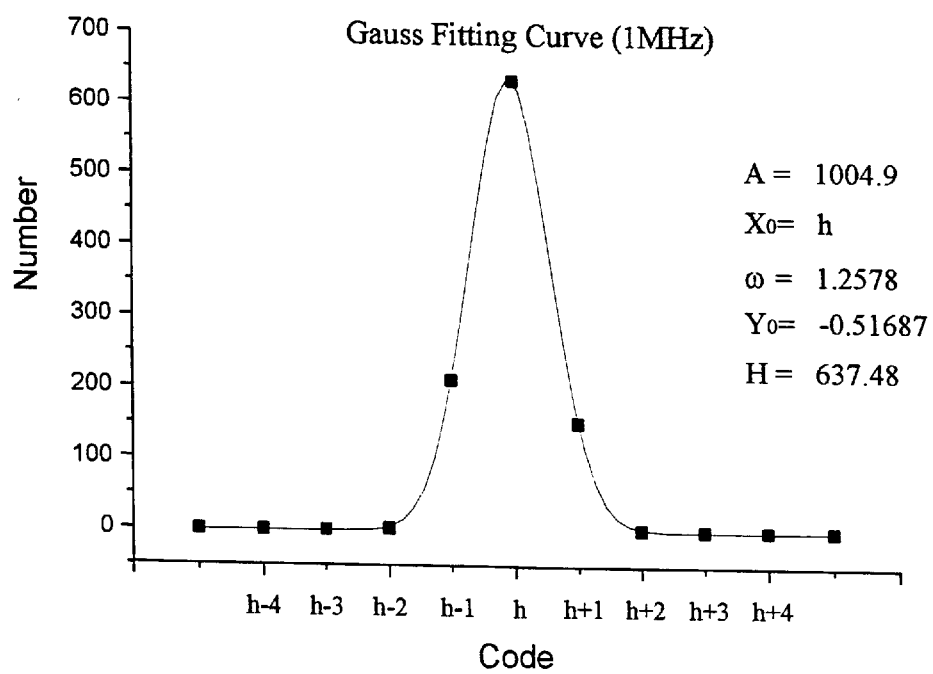
FIG. 5 shows the Gaussian curve fitting of the distribution of dynamic deviation for 1 MHz input frequency.

, where $Y_0$ is baseline offset, A is total area under the curve from the baseline, $X_0$ is the center of the peak, $\omega$ is 2 "sigma", approximately 0.849 the width of the peak at half height. FIG. 5 shows the Gaussian curve fitting of the distribution of dynamic deviation for 1 MHz input frequency. Because the deviation is only several LSBs, the numbers for larger deviations are all zero. Let $Y_0$ equal to zero, and then the equation can be simplified as follows:

$$Y = He^{\frac{-2(\Delta X)^2}{\omega^2}} \quad (2)$$

$$H = \frac{A}{\omega\sqrt{\frac{\pi}{2}}} \quad (3)$$

where A=1000 in experiments according to the present invention. From the above two equations, it shows that Y is a function of ω. Namely, ω is a factor to reveal the degree of the distribution of dynamic deviation.

Figure 6:
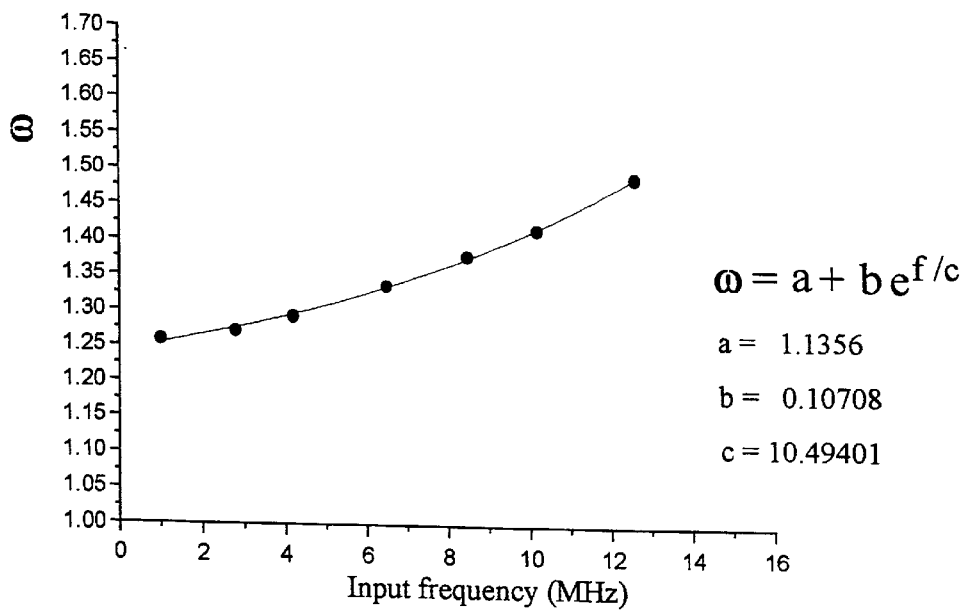
FIG. 6 shows the relation between ω revealing the degree of the distribution of dynamic deviation and the input frequency of the signal applied to an ADC.
Figure 7:
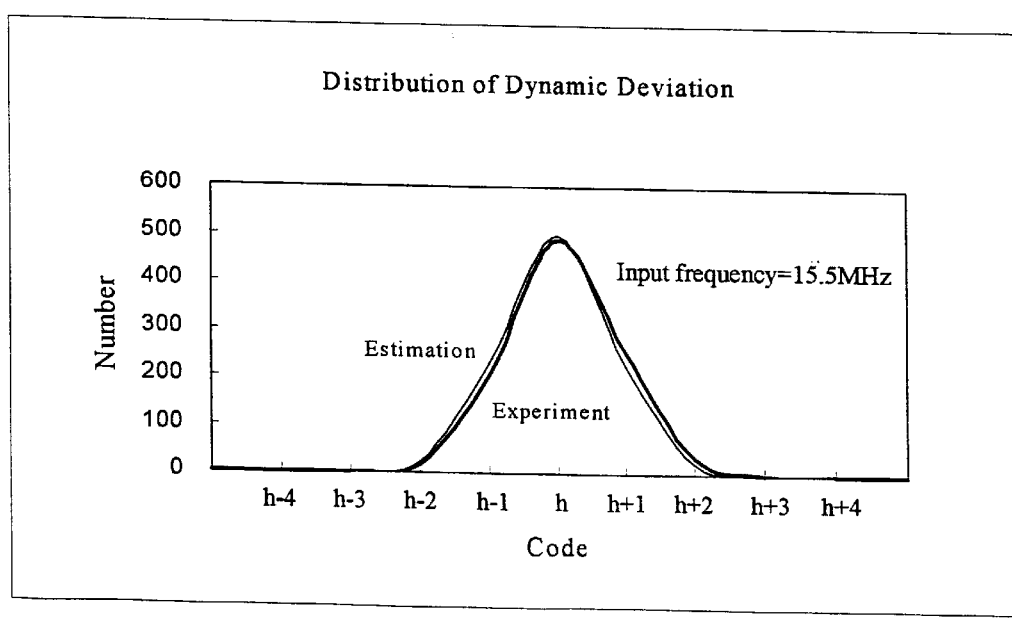
FIG. 7 shows the comparison between the distributions of dynamic deviations for estimation and experiment on a 15.5 MHz input sinusoid.

FIG. 6 shows the relation between ω revealing the degree of the distribution of dynamic deviation and the input frequency of the signal applied to an ADC. From the drawing, it can be found that ω increases as the frequency increases and ω approaches a tendency of exponential function of frequency. The ω in the drawing can be well-fitted by an equation ω=a+b $e^{f/c}$, where f is the input frequency and a, b, and c are constants 1.1356, 0.10708, and 10.49401, respectively.

ω can be estimated by using the function mentioned above at 15.5 MHz input frequency. (This frequency is only used to evaluate the accuracy of prediction by this equation.) The values of ω obtained from experiment and estimation were 1.621 and 1.605, respectively. FIG. 7 shows the comparison between the distributions of dynamic deviations for estimation and experiment on a 15.5 MHz input sinusoid. The curves meet very closely and this indicates that the prediction of distribution of dynamic deviation for higher input frequency is feasible.

3.3 Distribution of Dynamic Deviation for Different Performance ICs

Figure 8:
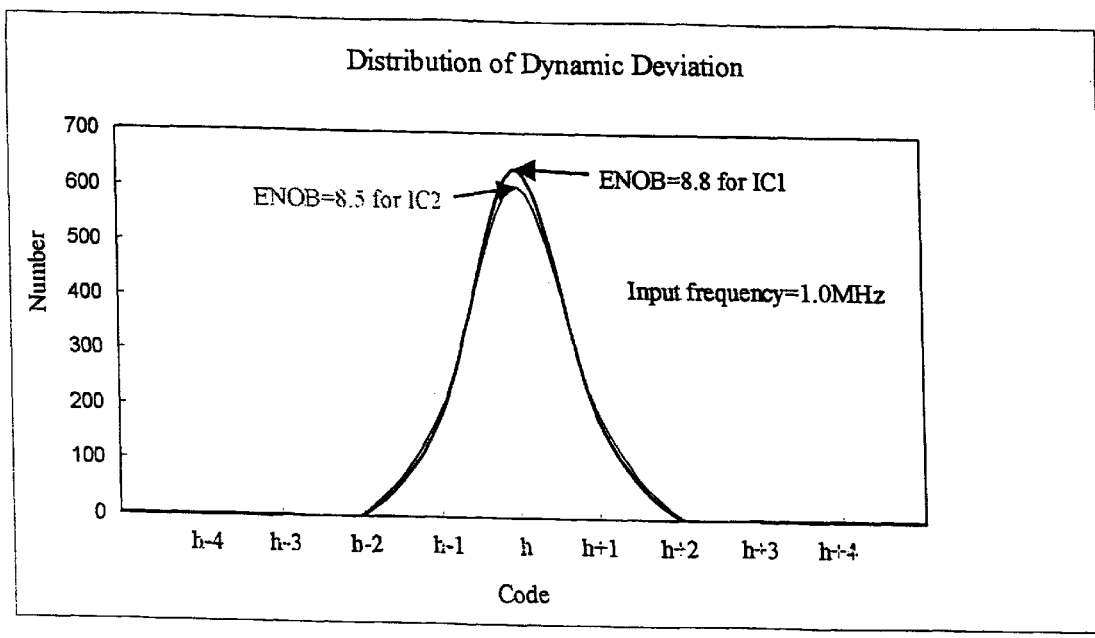
FIG. 8 shows the comparison between dynamic deviations for 1.0 MHz input frequency of IC1 (normal IC) and IC2 (worse-performance IC); and TABLE 1 shows the comparison of experiment results on ENOB between estimations and experiments.

As mentioned in 3.2, dynamic deviation is a very useful parameter of an ADC. It is extracted from the real test setup and thus can take noises and clock jitter into account. The distribution of dynamic deviation exhibits as a Gaussian distribution and varies its peak and expansion with different input frequencies. Therefore, dynamic deviation can serve as a novel parameter for use in evaluating the performance of an ADC. FIG. 8 shows the comparison between dynamic deviations for 1.0 MHz input frequency of IC1 (normal IC) and IC2 (worse-performance IC). As can be seen in the drawing, the peak and expansion of the distribution of dynamic deviation of the latter is lower and wider than that of the former. In other words, a more concentrated distribution of dynamic deviation is obtained for a better performance IC.

3.4 Experimental Results for ENOB Estimation Experiments with 1.011, 4.438, and 10.005 MHz input frequencies were further done to evaluate the accuracy and feasibility of the proposed estimation. Comparison of results on ENOB between estimations and experiments was made and complied in Table 1. The results of ENOB measurements for each input frequency fluctuated a little due to noises and clock jitter although all the setup was the same. Our estimated results on ENOB also varied a little. This implied that it was reasonable that we determined the variations of ideal codes by randomly generated numbers in the estimation procedure. On average, the results met closely for estimations and experiments and demonstrated that high accuracy of the proposed ENOB estimation was achieved.

In conclusion, dynamic deviation is a significant parameter to evaluate dynamic performance for ADCs. From the previous discussion, a more concentrated distribution of dynamic deviation is obtained for a better performance IC. The distribution of dynamic deviation can be fitted by a Gaussian curve and it is a function of ω, 2 "sigma" of Gaussian. The value of ω increases as the input frequency increases and approaches a tendency of exponential function of the input frequency, and thus we can predict dynamic performance for higher frequency. The correlation between dynamic deviation and ENOB is also investigated. Based on the distribution of dynamic deviation, an approach is presented to model the real codes of the outputs of an ADC by adding variations to ideal codes. Performing FFT operations for these codes to estimate ENOB for ADCs is then proposed. The results meet closely for estimations and experiments and demonstrate that high accuracy of our ENOB estimation is achieved. ENOB can be therefore predicted for higher input frequency for an ADC without a high-quality signal generator by measuring dynamic deviation for lower input frequency.

When practically using the present invention, we can build up the distribution of dynamic deviation for the representative code. For instance, we can take the distribution of averaged dynamic deviation of 16 codes and regard it as distribution of the dynamic deviation. We can further establish the distributions in the test programs, because we only have to establish the distribution of dynamic deviation once. On testing, the outputs around the 16 codes are recorded, so the time for testing dynamic deviation to evaluate dynamic performance of an ADC is short, compared to testing time for the whole ADC. (The testing time for an ADC is dominated strongly on the testing for differential non-linearity and integral non-linearity).

As discussed so far, in accordance with the present invention, there are provided a device and method therefor for ENOB estimation for an ADC based on dynamic deviation, wherein dynamic deviation as provided can serve as a novel parameter and be used to replace static noise to evaluate the dynamic performance of an ADC, and can provide an approach, by which ENOB can be predicted accurately without a high-quality signal generator. Consequently, the present invention has been examined to be progressive and has great potential in commercial applications.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A method for ENOB (effective number of bits) estimation for an ADC (analog-to-digital converter) based on dynamic deviation, comprising steps of:

(a) building up the distributions of dynamic deviations for the interested input frequencies at which ENOBs will be estimated;

(b) calculating the ideal values that are sampled by an ADC in an ideal case according to the frequency and amplitude of the sinusoid and sampling rate of ADC;

(c) calculating the ideal codes with respect to the ideal values according to step (b);

(d) calculating the estimated codes by adding variations to the ideal codes according to step (c) with respect to the distributions of dynamic deviations according to step (a); and (e) estimating ENOB by performing FFT operations on these estimated codes according to step (d).

2. The method for ENOB estimation for an ADC based on dynamic deviation as recited in claim 1, wherein said distributions of dynamic deviations according to step (a) are built up for input sinusoid signals and said input frequencies are frequencies of said sinusoid signals.

3. The method for ENOB estimation for an ADC based on dynamic deviation as recited in claim 1, wherein said distributions of dynamic deviations according to step (a) can be fitted by Gaussian curves.

4. The method for ENOB estimation for an ADC based on dynamic deviation as recited in claim 1, wherein said distributions of dynamic deviations according to step (a) can be fitted by Gaussian curves as recited in claim 3 and the obtained value of ω (2 sigma) approaches a tendency of exponential function of the input frequency.

5. The method for ENOB estimation for an ADC based on dynamic deviation as recited in claim 1, wherein among said distributions of dynamic deviations according to step (a), a more concentrated distribution of dynamic deviation is obtained for an ADC with a lower input frequency.

6. The method for ENOB estimation for an ADC based on dynamic deviation as recited in claim 1, wherein among said distributions of dynamic deviations according to step (a), a more concentrated distribution of dynamic deviation is obtained for an ADC with better performance.

7. The method for ENOB estimation for an ADC based on dynamic deviation as recited in claim 1, wherein the values of said added variations between the ideal values of the input signals and the real values of the output signals of an ADC according to step (d) can be determined according to the distributions of dynamic deviations.

8. A device for ENOB estimation for an ADC based on dynamic deviation, comprising:

a low-jitter signal generator for generating sinusoid signals;

a low-pass filter that is connected to the output of said low-jitter signal generator to cooperate with said low-jitter signal generator to generate pure sinusoid signals;

an ADC evaluation board for receiving the filtered sinusoid signal from the output of said low-pass filter and then converting the received signals into digital ones;

a data-capture memory coupled to the output of said ADC evaluation board for storing the digital sampled signals and providing them for further analysis;

a bench-quality power supply coupled to said ADC evaluation board for providing the power source that the ADC needs; and a low-jitter clock source coupled to said ADC evaluation board for providing the timing signals that the ADC needs.

* * * * *